(12) United States Patent
Kim et al.

(10) Patent No.: US 9,859,024 B2
(45) Date of Patent: Jan. 2, 2018

(54) NONVOLATILE MEMORY CIRCUIT AND MEMORY DEVICE INCLUDING SAME

(71) Applicant: SK hynix Inc., Gyeonggi-do (KR)

(72) Inventors: Jong-Sam Kim, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/162,232

(22) Filed: May 23, 2016

(65) Prior Publication Data

US 2017/0178753 A1    Jun. 22, 2017

(30) Foreign Application Priority Data

Dec. 18, 2015    (KR) .......................... 10-2015-0181530

(51) Int. Cl.
*G11C 17/00*    (2006.01)
*G11C 29/00*    (2006.01)
*G06F 11/16*    (2006.01)
*G11C 17/16*    (2006.01)
*G11C 17/18*    (2006.01)

(52) U.S. Cl.
CPC .......... *G11C 29/787* (2013.01); *G06F 11/167* (2013.01); *G11C 17/16* (2013.01); *G11C 17/18* (2013.01)

(58) Field of Classification Search
None
See application file for complete search history.

(56) References Cited

U.S. PATENT DOCUMENTS

| 7,386,771 B2 * | 6/2008 | Shuma ............... G06F 11/1008 714/710 |
| 2004/0205290 A1 * | 10/2004 | Shinagawa ......... G06F 12/0246 711/103 |
| 2005/0270866 A1 * | 12/2005 | Ouellette ............... G11C 29/14 365/200 |
| 2015/0074474 A1 * | 3/2015 | Issa .................... G11C 29/4401 714/710 |

FOREIGN PATENT DOCUMENTS

| KR | 1020140139854 | 12/2014 |
| KR | 1020150072043 | 6/2015 |

\* cited by examiner

*Primary Examiner* — Uyen B Tran
(74) *Attorney, Agent, or Firm* — IP & T Group LLP (57) ABSTRACT

A nonvolatile memory circuit may include: a cell array including a first region comprising a plurality of first cell groups and a second region comprising a plurality of second cell groups, each of the first and second cell groups having one or more nonvolatile memory cells; and a control unit suitable for controlling the cell array to sequentially output repair addresses of the plurality of cells groups included in a region which is not over used among the first and second regions when one of the first and second regions is over used.

8 Claims, 5 Drawing Sheets

* ONLY RWL7 IS USED TO PREVENT ABOVE PROBLEM

NONVOLATILE MEMORY CIRCUIT AND MEMORY DEVICE INCLUDING SAME

CROSS-REFERENCE TO RELATED APPLICATIONS

The present application claims priority of Korean Patent Application No. 10-2015-0181530, filed on Dec. 18, 2015, which is incorporated herein by reference in its entirety.

BACKGROUND

1. Field

Exemplary embodiments of the present invention relate to a nonvolatile memory circuit and a memory device including the same.

2. Description of the Related Art

With the rapid increase in Integration degree of a memory device, tens of millions of memory cells are included in one memory device. When a fall occurs in any one of the memory cells, the corresponding memory device may not perform a desired operation. However, when a memory device is discarded as a defective product due to a fall occurring in a few memory cells, it is very inefficient in terms of the yield of products. The memory cell refers to a minimum unit that performs the unique function of the memory device. For example, the memory cell may indicate a unit cell for storing one-bit data.

Thus, in order to solve the above-described problem, a variety of methods have been attempted. For example, the variety of methods may include a method which can save a memory device using memory cells which are previously installed therein (hereafter, referred to as redundancy cells), even though a fail occurs in partial memory cells of the memory device. According to this method, a repair operation using redundancy cells is performed by replacing defective memory cells with redundancy cells in a row/column basis, using a redundancy row and a redundancy column which are previously installed in each cell block with a predetermined size.

Figure 1:
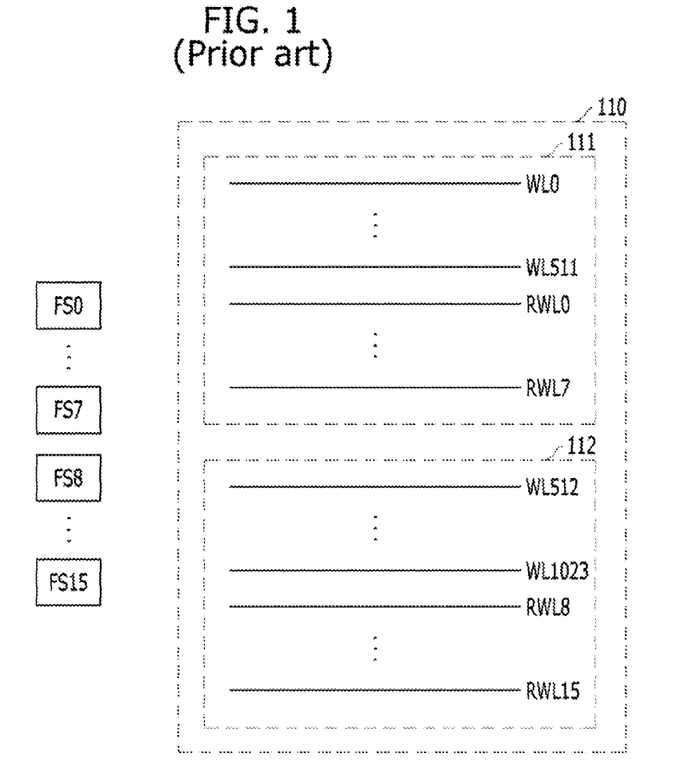
FIG. 1 is a diagram illustrating a conventional row repair operation of a memory device.

FIG. 1 is a diagram illustrating a row repair operation of a memory device.

Referring to FIG. 1, the memory device may include a memory bank 110 and a plurality of fuse sets FS0 to FS15. The memory bank 110 may be divided into first and second cell blocks 111 and 112. The first and second cell blocks 111 and 112 may include the plurality of word lines WL0 to WL511 and WL512 to WL1023 and a plurality of redundancy word lines RWL0 to RWL7 and RWL8 to RWL15, respectively.

Each of the fuse sets FS0 to FS15 may correspond to one of the redundancy word lines RWL0 to RWL15, and store the address of a word line which is repaired with the corresponding redundancy word line, among the word lines WL0 to WL1023. Hereafter, the address of the repaired word line will be referred to as repair address.

Since the memory bank 110 and the plurality of fuse sets FS0 to FS15 are remote from each other in the memory device, the memory device may sequentially transmit the repair addresses stored in the fuse sets FS0 to FS15 to latch sets (not illustrated in FIG. 1) which are positioned adjacent to the memory bank 110, and perform a repair operation using the transmitted repair addresses. The repair operation may indicate an operation of replacing a word line corresponding to a repair address with a redundancy word line.

Up to now, in existing devices, the redundancy word lines RWL0 to RWL7 corresponding to the fuse sets FS0 to FS7 are configured to repair only the word lines WL0 to WL511 of the first cell block 111 and the redundancy word lines RWL8 to RWL15 corresponding to the fuse sets FS8 to FS15 are configured to repair only the word lines WL512 to WL1023 of the second cell block 112. This e may lead to an inefficiency. When, for example, nine defective word lines occur only in the first cell block 111 of the memory bank 110, although the redundancy word lines RWL8 to RWL15 of the second cell block 112 are not yet used, the redundancy word lines RWL0 to RWL7 of the first cell block 111 cannot repair all of the nine defective word lines. Thus, the memory device is inevitably discarded as a defective product.

SUMMARY

Various embodiments are directed to a memory device capable of repairing a word line of a cell block with a redundancy word line of another cell block.

Also, various embodiments are directed to a nonvolatile memory circuit capable of repairing one word line with one redundancy word line even when the same two or more repair addresses are stored, and a memory device including the same.

In an embodiment, a nonvolatile memory circuit may include: a cell array including a first region comprising a plurality of first cell groups and a second region comprising a plurality of second cell groups, each of the first and second cell groups having one or more nonvolatile memory cells; and a control unit suitable for controlling the cell array to sequentially output repair addresses of the plurality of cells groups included in a region which is not over used among the first and second regions when one of the first and second regions is over used.

In an embodiment, a memory device may include: a memory bank comprising a plurality of memory cells and a plurality of redundancy cells; a nonvolatile memory unit suitable for sequentially outputting repair addresses of a plurality of cell groups included in a region which is not over used among a first region having a plurality of first cell groups and a second region having a plurality of second cell groups, when one of the first and second regions is over used; and a plurality of latch units each corresponding to one or more redundancy cells among the redundancy cells, and suitable for storing a repair address of a corresponding cell group among the first and second cell groups, wherein one or more memory cells corresponding to the repair address stored in the latch unit are repaired with one or more redundancy cells corresponding to the latch unit.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present disclosure.

It will be further understood that when an element is referred to as being "connected to", or "coupled to" another element, it can be directly on, connected to, or coupled to the other element, or one or more intervening elements may be present. In addition, it will also be understood that when an element is referred to as being "between" two elements, it can be the only element between the two elements, or one or more intervening elements may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

Figure 2:
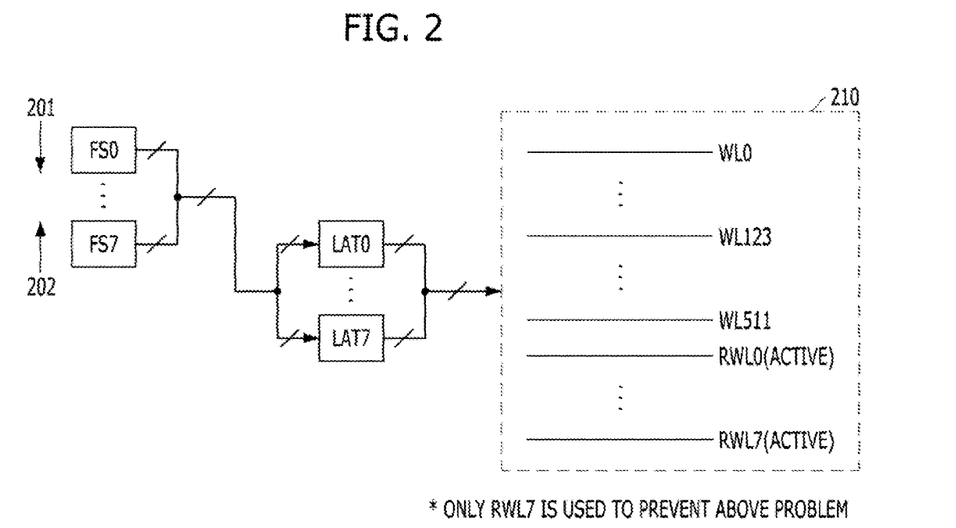
FIG. 2 is a diagram illustrating a method capable of solving a problem which occurs when the same two or more repair addresses are stored in a memory device, according to an embodiment of the present invention.

FIG. 2 is a diagram illustrating a method capable of solving a problem which occurs when the same two or more repair addresses are stored in a memory device.

Referring to FIG. 2, the memory device may include a memory bank 210, a plurality of fuse sets FS0 to FS7, and a plurality of latch units LAT0 to LAT7.

The memory bank 210 may include a plurality of word lines WL0 to WL511 and a plurality of redundancy word line RWL0 to RWL7. Each of the fuse sets FS0 to FS7 may correspond to one of the redundancy word lines RWL0 to RWL7. Each of the fuse sets FS0 to FS7 may store the address of a word line which is repaired with a corresponding redundancy word line. Hereafter, the address of a repaired word line will be referred to as a repair address. Each of the latch units LAT0 to LAT7 may correspond to one fuse set of the fuse sets FS0 to FS7, and correspond to one redundancy word line of the redundancy word lines RWL0 to RWL7.

When a defective word line is detected through a test of the memory device, the address of the defective word line (i.e., the repair address) may be programmed to a fuse set of the plurality of fuse sets FS0 to FS7. At this time, the fuse sets may be used in sequence. That is, the repair addresses may be sequentially programmed to the fuse sets, starting with the first fuse set FS0 for the first repair address, then the second fuse set FS1 for the second repair address, and so forth until an eighth repair address is programmed into the eighth fuse set FS7.

The repair addresses stored in the fuse sets FS0 to FS7 may be transmitted to the latch units LAT0 to LAT7 through a boot-up operation, at a period in which the memory device is initialized for operation of the memory device. During the boot-up operation, the repair addresses stored in the plurality of fuse sets FS0 to FS7 may be sequentially transmitted one by one and stored in the corresponding latch units LAT0 to LAT7. At this time, the sequence that the fuse sets are selected for transmission to the corresponding latches may be the opposite of the sequence that the fuse sets are selected when the repair addresses are programmed. That is, the repair addresses may be transmitted in sequence starting with the eighth fuse set FS7, then the seventh fuse set FS6, followed by the sixth FS5, fifth FS4, fourth FS3, third FS2, second FS1 and first fuse set FS0, in the recited order.

In FIG. 2, a first direction 201 may indicate the sequence that the fuse sets are selected during a program operation, that is, the sequence that the fuse sets are used, and a second direction 202 may indicate the sequence that the fuse sets are selected during the boot-up operation, that is, the sequence that the repair addresses are transmitted.

The memory device may compare an address inputted with an active command to the addresses of the latch units LAT0 to LAT7. The address inputted with the active command is not illustrated in FIG. 2. When the input address is different from the addresses of the latch units LAT0 to LAT7, the memory device may activate a word line corresponding to the input address. When the input address is equal to any one of the addresses of the latch units LAT0 to LAT7, the memory device may activate a redundancy word line corresponding to the latch unit storing the address that is equal to the input address.

In the example of the memory device of FIG. 2, we suppose that a repair address corresponding to the word line WL123 was programmed in two fuse sets FS0 and FS7. Such a repair address may be transmitted and stored in two latch units LAT0 and LAT7 through a boot-up operation. In this case, when an address corresponding to the word line WL123 is inputted with an active command, two redundancy word lines RWL0 and RWL7 may be activated together to replace the word line WL123, and data stored in redundancy cells (not illustrated in FIG. 2) coupled to the redundancy word lines RWL0 and RWL7 may collide with each other.

In order to prevent such a problem, when the same two or more repair addresses are transmitted during the boot-up operation, the memory device may repair a word line corresponding to the repair address with the redundancy word line corresponding to the latch unit storing the repair address which was first transmitted. In the above-described example, the memory device may repair the word line WL123 corresponding to the repair address with the redundancy word line RWL7 corresponding to the latch unit LAT7 storing the repair address which was first transmitted, between the latches LAT0 and LAT7 storing the address of the word line WL123.

For reference, the reason that when the same repair address is stored in two or more fuse sets, a word line corresponding to the repair address is repaired with a redundancy word line corresponding to a latch unit storing the repair address which was first transmitted may be described as follows. When the same repair address is stored in two or more fuse sets, it may indicate that two or more fails were detected in the word line selected by the repair address.

For example, suppose that the word line WL123 was replaced with the redundancy word line RWL0 because a fail was detected in the word line WL123, and the redundancy word line RWL0 was then replaced with another redundancy word line RWL7 because a fail was detected in the redundancy word line RWL0. In this case, the repair address corresponding to the word line WL123 may be stored in the fuse set FS0 and the fuse set FS7. In such an example, since a fail has already occurred in the redundancy word line RWL0 which had first repaired the word line WL123, the redundancy word line RWL0 must not be used, and the redundancy word line RWL7 which was last to repair the word line WL123 must be used. Since the sequence that the fuse sets are used is the opposite to the sequence that the fuse sets are selected during the boot-up operation, the word line must be repaired with the redundancy word line corresponding to the latch unit storing the repair address which was first transmitted.

Figure 3:
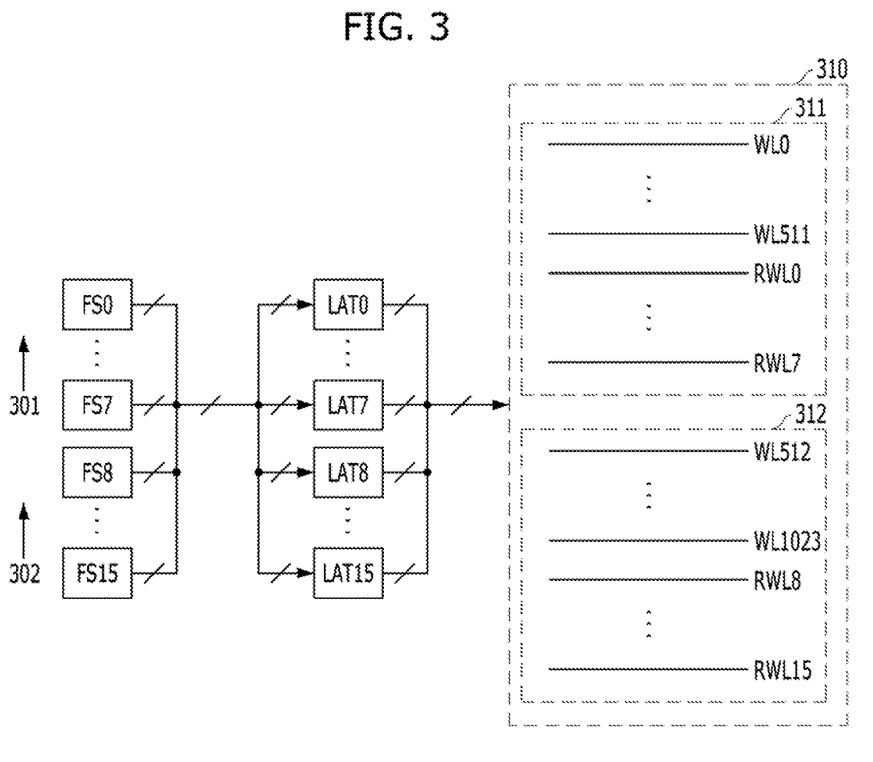
FIG. 3 is a diagram illustrating a problem which may occur in a memory device capable of repairing a word line of a cell block with a redundancy word line of another cell block, according to an embodiment of the present invention.

FIG. 3 is a diagram illustrating a problem which may occur in a memory device capable of repairing a word line of a cell block with a redundancy word line of another cell block.

Referring to FIG. 3, the memory device may include a memory bank 310, a plurality of fuse sets FS0 to FS15, and a plurality of latch units LAT0 to LAT15.

The memory bank 310 may be divided into first and second cell blocks 311 and 312. The first and second cell blocks 311 and 312 may include the plurality of word lines WL0 to WL511 and WL512 to WL1023, respectively. The first and second cell blocks 311 and 312 may also include a plurality of redundancy word lines RWL0 to RWL7 and RWL8 to RWL15, respectively.

Each of the fuse sets FS0 to FS15 may correspond to one of the redundancy word lines RWL0 to RWL15, and store the address of a word line among the word lines WL0 to WL1023 which is repaired with a corresponding redundancy word line. Each of the latch units LAT0 to LAT15 may correspond to a single fuse set of the fuse sets FS0 to FS15, and correspond to a single redundancy word line of the redundancy word lines RWL0 to RWL15.

The first fuse sets FS0 to FS7 of the memory device of FIG. 3 may store a first repair address detected in the first cell block 311. When all of the second fuse sets FS8 to FS15 are used, the first fuse sets FS0 to FS7 may store a second repair address detected in the second cell block 312. The second fuse sets FS8 to FS15 may store the second repair addresses. When all of the first fuse sets FS0 to FS7 are used, the second fuse sets FS8 to FS15 may store the first repair address. Hereinafter for ease of reference, all repair addresses of the first cell block will be referred to as first block repair addresses, while all repair addresses of the second cell block will be referred to as second block repair addresses.

In the memory device of FIG. 3, the fuse sets may be used according to the following sequence.

When the first block repair addresses are programmed, the first fuse sets may be used in a sequence starting with the first fuse set FS0, . . . , the first fuse set FS7. Then, an unused second fuse set among the second fuse sets FS8 to FS15 may be used. When the second block repair addresses are programmed, the second fuse sets may be used in a sequence starting with the second fuse set FS8, . . . , the second fuse set FS15. Then, an unused first fuse set among the first fuse sets FS0 to FS7 may be used.

During a boot-up operation in the memory device of FIG. 3, the fuse sets may be selected in sequence 301 of the first fuse set FS7, . . . , the first fuse set FS0, and then selected in sequence 302 of the second fuse set FS15, . . . , the second fuse set FS8, and the repair addresses stored in the selected fuse sets may be sequentially transmitted.

At this time, when the same repair address is stored in two or more fuse sets, the redundancy word line corresponding to the latch unit storing the repair address which was first transmitted may repair the word line corresponding to the repair address, as described with reference to FIG. 2.

When a first block repair address is stored in a second fuse set because all of the first fuse sets FS0 to FS7 are used the first fuse sets FS0 to FS7 may be referred to as being 'over used'. When a second block repair address is stored in a first fuse set because all of the second fuse sets FS8 to FS15 are used, the second fuse sets FS8 to FS15 fuse sets may be referred to as being 'over used'.

Hereafter, the case in which the first fuse sets FS0 to FS7 are over used and the same repair address is stored in the first fuse set FS0 and the second fuse set FS8 will be taken as an example illustrating a problem which may occur in the memory device of FIG. 3.

Considering the sequence that the fuse sets are used when the first repair addresses are programmed, the first repair address stored in the second fuse set FS8 may be determined to be stored later than the first repair address stored in the first fuse set FS0. Thus, the word line corresponding to the first repair address stored in the first fuse set FS0 and the second fuse set FS8 must be repaired with the redundancy word line RWL8. However, since the repair addresses are transmitted in sequences 301 and 302 of the first fuse set FS7, . . . , the first fuse set FS0, . . . , the second fuse set FS15, . . . , the second fuse set FS8 during the boot-up operation, the word line corresponding to the repair address may be repaired with the redundancy word line RWL0 corresponding to the latch unit LAT0 which stores the repair address which was first transmitted.

Figure 4:
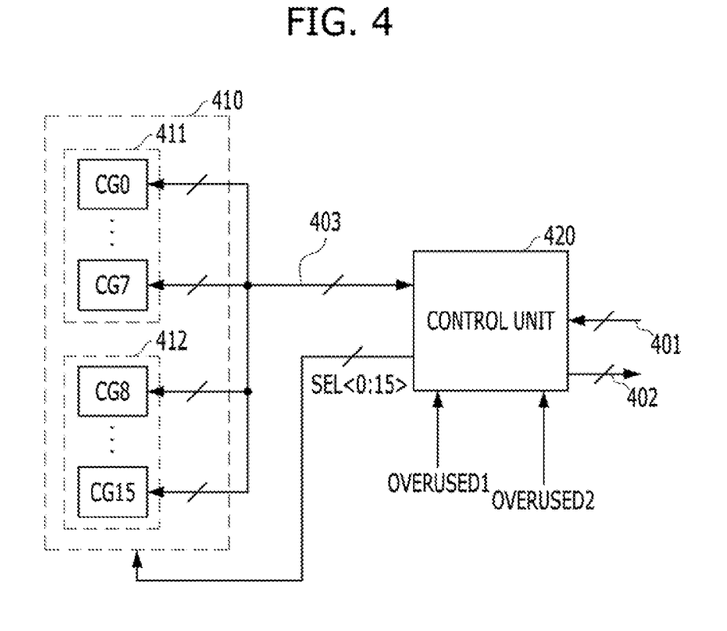
FIG. 4 is a diagram of a nonvolatile memory circuit according to an embodiment of the invention an embodiment of the present invention.

FIG. 4 is a diagram of a nonvolatile memory circuit, according to an embodiment of the present invention.

Referring to FIG. 4, the nonvolatile memory circuit may include a cell array 410 and a control unit 420.

The cell array 410 may be divided in a first region 411 and a second region 412. The first region 411 may include a plurality of first cell groups CG0 to CG7 each having one or more nonvolatile memory cells. The second region 412 may include a plurality of second cell groups CG8 to CG15 each having one or more nonvolatile memory cells. A memory cell including various elements, such as a fuse cell, an anti-fuse cell, a variable resistor cell, or a floating gate element cell may be used as the nonvolatile memory cell.

Hereafter, 'over used' may represent a case wherein a first region repair address is programmed to an unused second cell group among the second cell groups CG8 to CG15 of the second region 412 because all of the first cell groups CG0 to CG7 of the first region 411 are used to store first region repair addresses; or the case in which a second region repair address is programmed to an unused first cell group among the first cell groups CG0 to CG7 of the first region 411 because all of the second cell groups CG8 to CG15 of the second region 412 are used to store second region repair addresses.

The sequence that the first cell groups CG0 to CG7 are used in the first region 411 may be the opposite of the sequence that the first cell groups CG0 to CG7 are selected during the boot-up operation. Furthermore, the sequence that the second cell groups CG8 to CG15 are used in the second region 412 may be the opposite of the sequence that the second cell groups CG8 to CG15 are selected during the boot-up operation. When the first region 411 is over used, a first overused signal OVERUSED1 may be activated. When the second region 412 is over used, a second overused signal OVERUSED2 may be activated.

The control unit 420 may select a cell group to program or output a repair address, among the first and second cell groups CG0 to CG15, and control the selected cell group to program a repair address therein or output a repair address. The following descriptions will be focused on the operation of the control unit 420 during the boot-up operation. When one of the first and second regions 411 and 412 is overused during the boot-up operation, the control unit 420 may control the cell array 410 so that the repair addresses of the plurality of cell groups in the region which is not overused among the first and second regions 411 and 412 are sequentially transmitted first. Then, the repair addresses of the plurality of cell groups in the overused region may be sequentially transmitted.

According to a first embodiment, the control unit 420 may control the first and second regions 411 and 412 to transmit the repair addresses in a sequence starting with the first region 411 first followed by the second region 412 second, when both of the first and second regions 411 and 412 are not overused, or when only the second region 412 is overused. Further, the control unit 420 may control the first and second regions 411 and 412 to transmit the repair addresses in a sequence starting with the second region 412 first followed by the first region 411 second, when the first region 411 is over used.

According to an embodiment of the invention a second embodiment, the control unit 420 may control the first and second regions 411 and 412 to transmit the repair addresses in a sequence starting with the second region 412 first followed by the first region 411 second, when both of the first and second regions 411 and 412 are not overused or when the first region 411 is over used. Further, the control unit 420 may control the first and second regions 411 and 412 to transmit the repair addresses in a sequence starting with the first region 411 first followed by the second region 412 second, when the second region 412 is overused.

When the repair addresses are transmitted in a sequence starting with the first region 411 first followed by the second region 412 second, the cell groups may be selected in a sequence starting with the first cell group CG7 followed by the remaining first cell groups CG6, CG4, CG3, CG2, CG1, and CG0 in the recited order, then with second cell group CG15, followed by the remaining second cell groups CG14, CG13, CG12, CG11, CG10, CG9, and CG8 in the recited order. When the repair addresses are transmitted in a sequence starting with the second region first 412 followed by the first region 411 second, the cell groups may be selected in a sequence starting with the second cell group CG15, followed by the remaining second cell groups CG14, CG13, CG12, CG11, CG10, CG9, and CG8 in the recited order, then with the second cell group CG8, followed by the remaining first cell groups CG6, CG4, CG3, CG2, CG1, and CG0 in the recited order.

Figure 5:
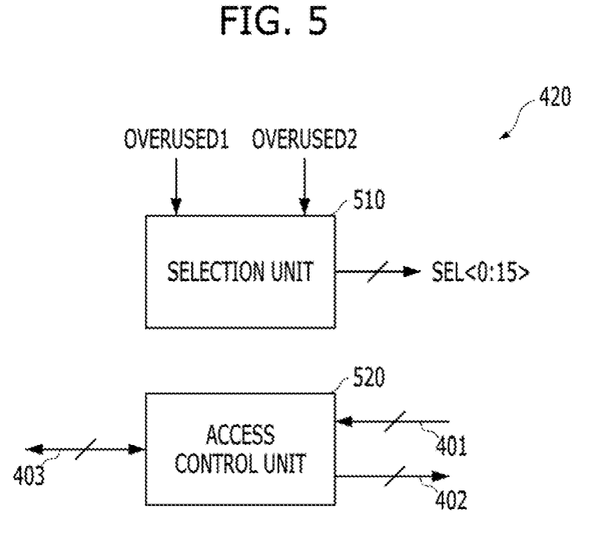
FIG. 5 is a diagram of a control unit according to an embodiment of the invention an embodiment of the present invention.

FIG. 5 is a diagram of a control unit according an embodiment of the present invention. The control unit of FIG. 5 may be the control unit 420 in FIG. 4.

Referring to FIG. 5, the control unit 420 may include a selection unit 510 and an access control unit 520.

The selection unit 510 may generate select signals SEL<0:15> for selecting one cell group among the cell groups CG0 to CG15 during a program or boot-up operation, and activate the select signals SEL<0:15> in a predetermined sequence. The selection unit 510 may activate the select signals in a sequence starting with SEL<0>, . . . , SEL<7> when a first repair address is programmed during a program operation. Further, the selection unit 510 may activate a select signal corresponding to an unused second cell group among the second cell groups CG8 to CG15 when all of the first cell groups CG0 to CG7 are used. The selection unit 510 may activate the select signals in a sequence starting with SEL<8>, . . . , SEL<15> when a second repair address is programmed. Further, the selection unit 510 may activate a select signal corresponding to an unused first cell group among the first cell groups CG0 to CG7 when all of the second cell groups CG8 to CG15 are used.

In the control unit 420 according to the first embodiment, the selection unit 510 may activate the select signals in a sequence starting with SEL<7>, . . . , SEL<0>, SEL<15>, . . . , SEL<8> when the first overused signal OVERUSED1 is deactivated. Further, the selection unit 510 may activate the select signals in a sequence starting with SEL<15>, . . . , SEL<8>, SEL<7>, . . . , SEL<0> when the first overused signal OVERUSED1 is activated.

In the control unit 420 according to a second embodiment, the selection unit 510 may activate the select signals in a sequence starting with SEL<15>, . . . , SEL<8>, SEL<7>, . . . , SEL<0> when the second overused signal OVERUSED2 is deactivated. Further, the selection unit 510 may activate the select signals in a sequence starting with SEL<7>, . . . , SEL<0>, SEL<15>, . . . , SEL<8> when the second overused signal OVERUSED2 is activated.

The access control unit 520 may control a selected cell group to program a repair address therein or control the selected cell group to output a repair address. The access control unit 520 may program a repair address inputted through a first bus 401 to a cell group corresponding to an activated select signal during a program operation. Furthermore, the access control unit 520 may output a repair address stored in a cell group corresponding to an activated select signal through a second bus 402, during a boot-up operation. The data transmission between the control unit 420 and the cell array 410 may be performed through a third bus 403. Each of the first to third buses 401 to 403 may include a plurality of lines for transmitting signals.

Figure 6:
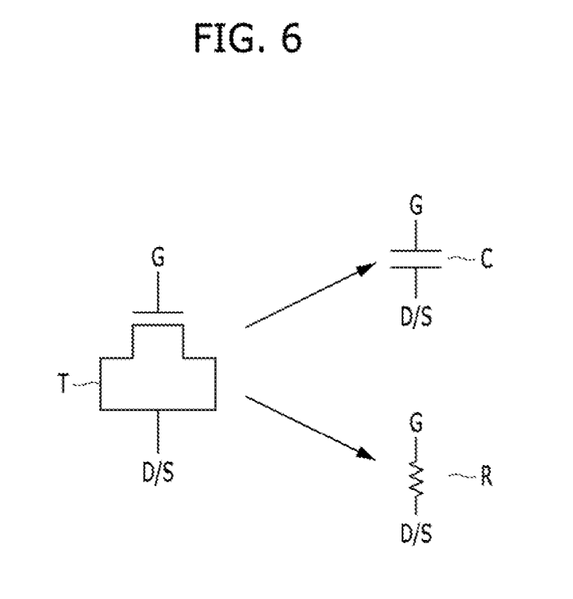
FIG. 6 is a diagram illustrating an e-fuse including a transistor that operates as a resistor or capacitor.

FIG. 6 is a diagram illustrating an e-fuse including a transistor which operates as a resistor or capacitor.

In a general fuse, data may be classified according to whether the fuse was cut by laser. Thus, the fuse can be programmed in a wafer state, but cannot be programmed after the wafer is mounted in a package. In order to overcome such a disadvantage, an e-fuse may be used. The e-fuse refers to a fuse which stores data by changing resistance between the gate and the drain/source of a transistor.

Referring to FIG. 6, the e-fuse may include a transistor T which has a gate G configured to receive a supply voltage and a drain D/source S configured to receive a ground voltage.

When a normal supply voltage which the transistor T can endure is applied to the gate G, the e-fuse operates as a capacitor C. Thus, there is no current flowing between the gate G and the drain/source D/S. However, when a high supply voltage which the transistor T cannot endure is applied to the gate G, the gate G and the drain/source D/S are shorted as the gate oxide of the transistor T is overcome. Then, the e-fuse operates as a resistor R. Thus, a current may then flow between the gate G and the drain/source D/S. Based on such a phenomenon, the data of the e-fuse may be recognized through the resistance value between the gate G and the drain/source D/S of the e-fuse. At this time, in order to recognize the data of the e-fuse, two methods may be considered as examples. A first method wherein the size of the transistor T may be increased to directly recognize the data without a separate sensing operation, or a second method wherein the data of the e-fuse may be recognized by sensing a current flowing in the transistor T using an amplifier, instead of reducing the size of the transistor T. The aforementioned two methods generally require that the transistor T forming the e-fuse to have a large size or that an amplifier for amplifying data is provided for each e-fuse.

Figure 7:
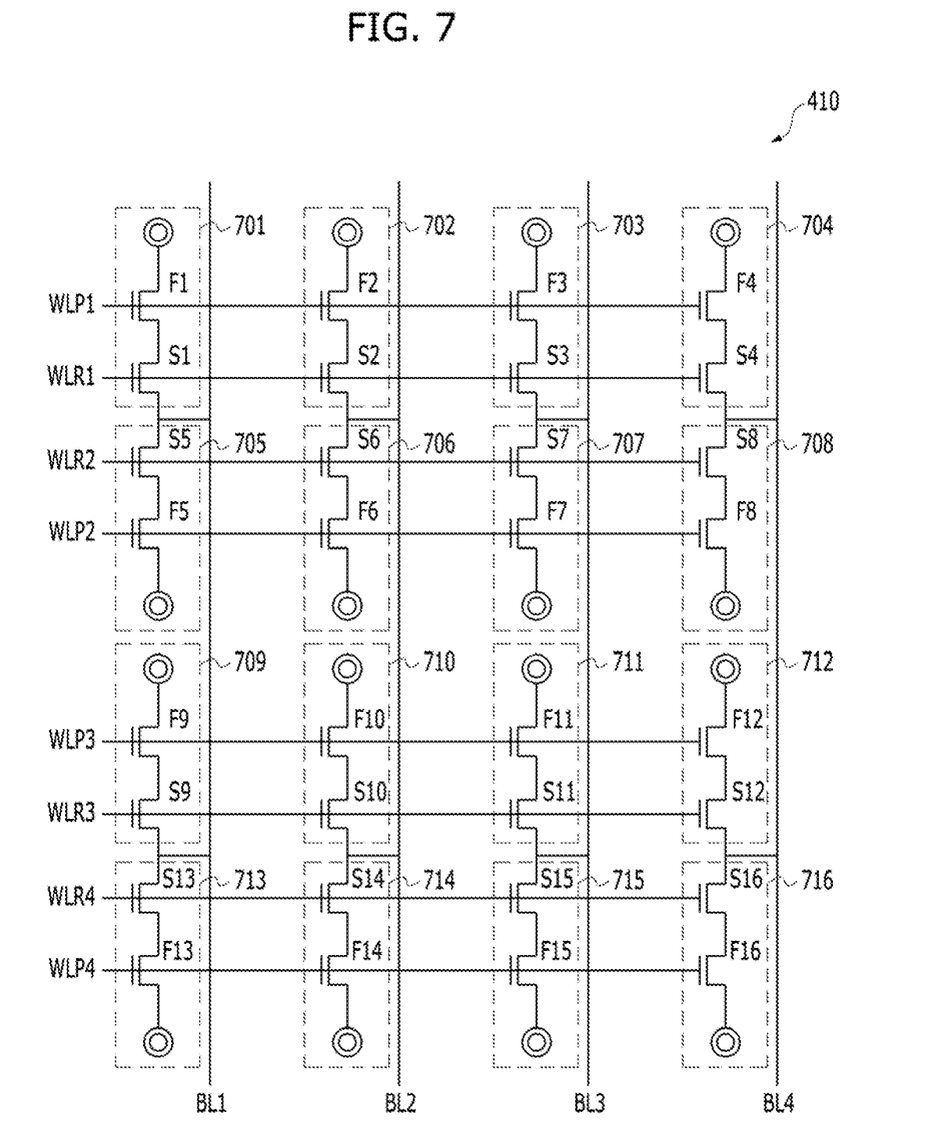
FIG. 7 is a diagram illustrating a part of a cell array configured as an E-fuse.

FIG. 7 is a diagram illustrating a part of the cell array configured as an E-fuse. For example, the cell array of FIG. 7 may be the cell array 410 of FIG. 4.

Referring to FIG. 7, the cell array 410 may include a plurality of fuse cells 701 to 716 arranged in a matrix shape. The fuse cells 701 to 716 may include fuse transistors F1 to F16 and select transistors S1 to S16, respectively. The fuse transistors F1 to F16 may include e-fuses which have the property of a resistor or capacitor according to whether the e-fuses are ruptured. That is, the e-fuses F1 to F16 may be considered as resistive fuse transistors to store data according to the magnitude of the resistor. The select transistors S1 to S16 may electrically couple the fuse transistors F1 to F16 and column lines (or bit lines) BL1 to BL4 according to control of row lines (or word lines) WLR1 to WLR4.

During a program operation, a selected row line may be enabled to turn on select transistors, and a high voltage may be applied to a selected program/read line. Furthermore, a low-level or high-level voltage may be applied to a selected column line. In the former case, a selected fuse is programmed (ruptured), and in the latter case, a selected fuse is not programmed.

During a read operation, a selected row line may be enabled to turn on select transistors, and a voltage suitable for the read operation may be applied to a selected program/read line. Furthermore, a low-level voltage may be applied to a selected column line. At this time, when a current is passed to the selected column line, it may be recognized that a fuse was programmed, and when no current is passed, it may be recognized that the fuse was not programmed.

In FIG. 7, a group of fuse cells capable of storing one repair address may correspond to one cell group of FIG. 4. For example, since the repair address has 10 bits, the group may include 10 fuse cells.

Figure 8:
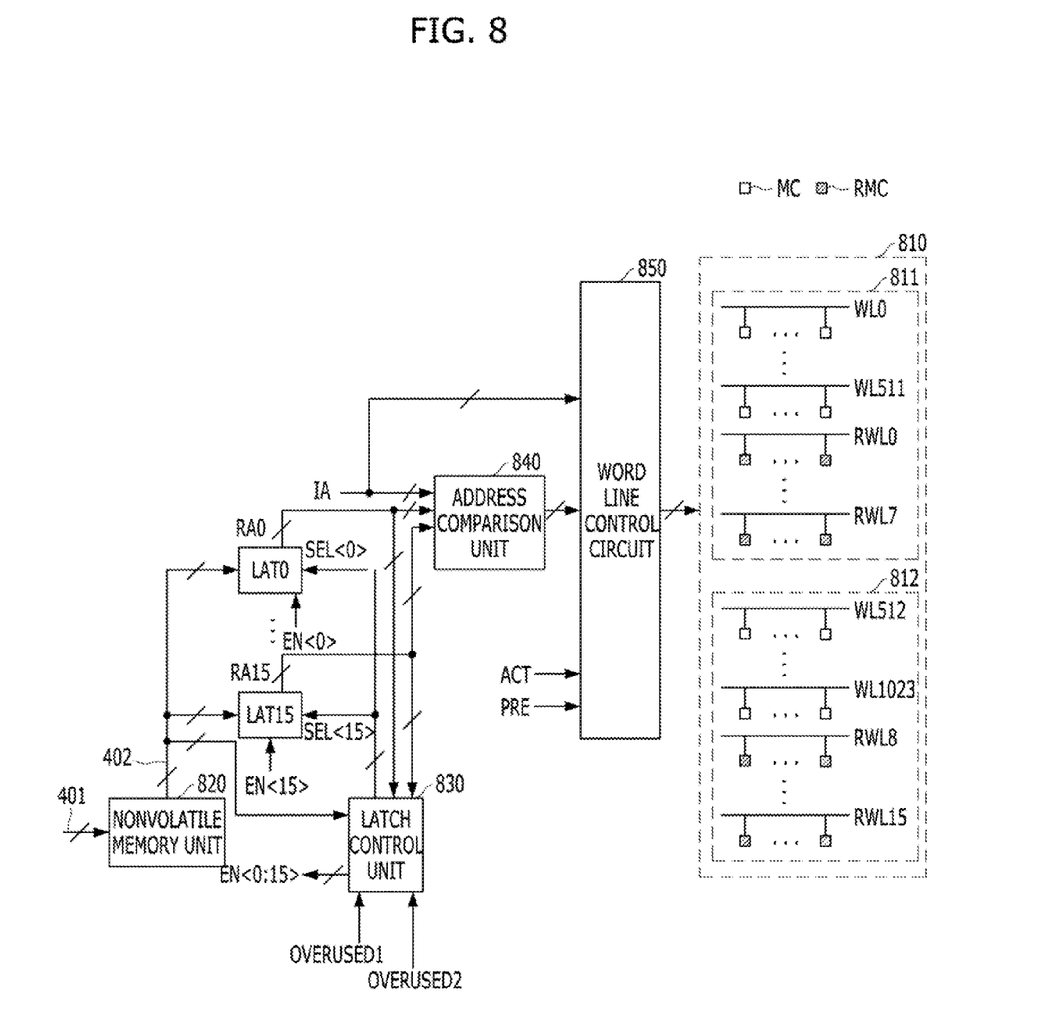
FIG. 8 is a diagram of a memory device, according to an embodiment of the invention an embodiment of the present invention.

FIG. 8 is a diagram of a memory device according to an embodiment of the present invention.

Referring to FIG. 8, the memory device may include a memory bank 810, a nonvolatile memory unit 820, a plurality of latch units LAT0 to LAT15, a latch control unit 830, an address comparison unit 840, and a word line control circuit 850. FIG. 8 illustrates the configuration for a row operation of the memory device, but does not illustrate the configuration for the column operation of the memory device, because the configuration for a column operation is well known and is not required for illustrating the present invention.

The memory bank 810 may include first and second cell blocks 811 and 812. The first cell block 811 may include a plurality of first word lines WL0 to WL511 and a plurality of first redundancy word lines RWL0 to RWL7. The second cell block 812 may include a plurality of second word lines WL512 to WL1023 and a plurality of second redundancy word lines RWL8 to RWL15. Each of the first word lines WL0 to WL511 may be coupled to one or more first memory cells MC, and each of the second word lines WL512 to WL1023 may be coupled to one or more second memory cells MC. Each of the first redundancy word lines RWL0 to RWL7 may be coupled to one or more first redundancy cells RMC, and each of the second redundancy word lines RWL8 to RWL15 may be coupled to one or more second redundancy cells RMC.

The nonvolatile memory unit 820 may include the nonvolatile memory device of FIG. 4.

The plurality of latch units LAT0 to LAT15 may be divided into the plurality of first latch units LAT0 to LAT7 and the plurality of second latch units LAT8 to LAT15. The first latch units LAT0 to LAT7 may correspond to the first cell groups CG0 to CG7, and correspond to the first redundancy word lines RWL0 to RWL7, respectively. The second latch units LAT8 to LAT15 may correspond to the second cell groups CG8 to CG15, and correspond to the second redundancy word lines RWL8 to RWL15, respectively. The first and second latch units LAT0 to LAT15 may be enabled when repair addresses are stored. When the first and second latch units LAT0 to LAT15 are enabled, the first and second latch units LAT0 to LAT15 may output the stored repair addresses RA0 to RA15.

The latch control unit 830 may generate select signals SEL<0:15> corresponding to the respective latch units LAT0 to LAT15, and activate the select signals SEL<0:15> in a predetermined sequence during a boot-up operation. According to an embodiment of the invention the first embodiment, the latch control unit 830 may activate the select signals in a sequence starting with SEL<7>, . . . , SEL<0>, SEL<15>, . . . , SEL<8> in case where the first over-used signal OVERUSED1 is deactivated, and activate the select signals in a sequence starting with SEL<15>, . . . , SEL<8>, SEL<7>, . . . , SEL<0> in case where the first over-used signal OVERUSED1 is activated. According to an embodiment of the invention the second embodiment, the latch control unit 830 may activate the select signals in a sequence starting with SEL<15>, . . . , SEL<8>, SEL<7>, . . . , SEL<0> in case where the second over-used signal OVERUSED2 is deactivated, and activate the select signals in a sequence starting with SEL<7>, . . . , SEL<0>, SEL<15>, . . . , SEL<8> in case where the second over-used signal OVERUSED2 is activated.

The latch control unit 830 may control the latch units LAT0 to LAT15 to store repair addresses transmitted from the nonvolatile memory unit 820, during a boot-up operation. When the same repair address is transmitted two or more times, the latch control unit 830 may disable the other latch units excluding the latch unit storing the repair address which was first transmitted, among the latch units storing the same repair address. For this operation, the latch control unit 830 may compare the addresses RA0 to RA15 latched in the respective latch units LAT0 to LAT15 to a repair address transmitted through the second bus 402, whenever the repair address is transmitted. When the repair address is equal to one of the addresses RA0 to RA15, the latch control unit 830 may disable the latch unit storing the repair address transmitted through the second bus 402.

The latch control unit 830 may generate a plurality of enable signals EN<0:15> corresponding to the respective latch units LAT0 to LAT15. When a latch unit is to be disabled, the latch control unit 830 may deactivate the enable signal corresponding to the latch unit. When a latch unit is to be enabled, the latch control unit 830 may activate the enable signal corresponding to the latch unit. The enable signals EN<0:15> may correspond the respective latch units LAT0 to LAT15.

The address comparison unit 840 may compare the repair addresses RA0 to RA15 outputted from the enabled latch unit among the latch units LAT0 to LAT15 to an input address IA inputted from outside the memory device. When the repair addresses RA0 to RA15 coincide with the input address IA, the address comparison unit 840 may control the word line control circuit 850 to activate a redundancy word line having repaired a word line corresponding to the input address IA, instead of the word line. That is, the word line corresponding to the repair addresses RA0 to RA15 stored in the enabled latch units LAT0 to LAT15 may be replaced with a redundancy word line. This may indicate that the memory cells MC coupled to the word line are replaced with the redundancy cells RMC coupled to the redundancy word line. In FIG. 8, ACT represents an active command to activate a selected word line, and PRE represents a precharge command to precharge an activated word line.

As such, the memory device of FIG. 8 using the nonvolatile memory device of FIG. 4 can repair a word line of one cell block with a redundancy word line of another cell block. Even when two or more repair addresses corresponding to a repaired word line are stored, the memory device can repair the word line without the problems described with reference to FIGS. 2 and 3.

According to an embodiment of the invention the memory device can repair a word line of a cell block using a redundancy word line of another cell block, thereby increasing the efficiency of the redundancy word line.

Furthermore, the nonvolatile memory circuit and the memory device including the same can repair one word line with one redundancy word line even when the same two or more repair addresses are stored.

Although various embodiments have been described for illustrative purposes, it will be apparent to those skilled in the art that various changes and modifications may be made without departing from the spirit and/or scope of the invention as defined in the following claims.

What is claimed is:

1. A nonvolatile memory circuit comprising:
   a cell array including a first region comprising a plurality of first cell groups and a second region comprising a plurality of second cell groups, each of the first and second cell groups having one or more nonvolatile memory cells; and
   a control unit suitable for controlling the cell array to sequentially output repair addresses of the plurality of cell groups included in a region which is not over used among the first and second regions when one of the first and second regions is over used,
   wherein the control unit is further suitable for controlling the cell array to sequentially output repair addresses of the plurality of cell groups included in the other region which is over used, after outputting the repair addresses of the plurality of cells groups included in the region which is not over used.

2. The nonvolatile memory circuit of claim 1, wherein the case in which one of the first and second regions is over used comprises a case in which a first repair address is stored in the plurality of first cell groups and the first repair address is stored in one or more second cell groups among the plurality of second cell groups, or a case in which a second repair address is stored in the plurality of second cell groups and the second repair address is stored in one or more first cell groups among the plurality of first cell groups.

3. The nonvolatile memory circuit of claim 1, wherein the control unit is further suitable for controlling the cell array to sequentially output the repair addresses stored in the plurality of first cell groups and then sequentially output the repair addresses stored in the plurality of second cell groups, when both of the first and second region are not over used.

4. The nonvolatile memory circuit of claim 1, wherein the control unit is further suitable for controlling the cell array to sequentially output the repair addresses stored in the plurality of second cell groups and then sequentially output the repair addresses stored in the plurality of first cell groups, when both of the first and second regions are not over used.

5. The nonvolatile memory circuit of claim 1, wherein a memory device including the nonvolatile memory circuit is discarded as a fail, when both of the first and second regions are over used.

6. The nonvolatile memory circuit of claim 1, wherein the control unit is suitable for controlling the plurality of first cell groups to program the repair addresses in the opposite sequence of the sequence that the stored repair addresses are outputted, and controlling the plurality of second cell groups to program the repair addresses in the opposite sequence of the sequence that the stored repair address are outputted.

7. The nonvolatile memory circuit of claim 1, wherein the nonvolatile memory cell comprises a fuse cell.

8. The nonvolatile memory circuit of claim 1, wherein the repair address comprises addresses of memory cells in which a fail occurred in a memory device including the nonvolatile memory circuit.

* * * * *